United States Patent
Khalili et al.

(10) Patent No.: US 12,557,245 B1
(45) Date of Patent: Feb. 17, 2026

(54) DUAL-PHASE EVAPORATIVE COOLING IN SEALED ELECTRONICS DEVICES

(71) Applicant: International Business Machines Corporation, Armonk, NY (US)

(72) Inventors: Sadegh Khalili, Poughkeepsie, NY (US); Yuanchen Hu, Peekskill, NY (US); Milnes P. David, New Paltz, NY (US); Levi Campbell, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 480 days.

(21) Appl. No.: 17/935,662

(22) Filed: Sep. 27, 2022

(51) Int. Cl.
*H05K 7/20* (2006.01)

(52) U.S. Cl.
CPC ..... *H05K 7/20309* (2013.01); *H05K 7/20318* (2013.01); *H05K 7/20327* (2013.01); *H05K 7/2039* (2013.01)

(58) Field of Classification Search
CPC ........... H05K 7/20309; H05K 7/20318; H05K 7/20327; H05K 7/2039
See application file for complete search history.

(56) References Cited

U.S. PATENT DOCUMENTS

| | | | |
|---|---|---|---|
| 5,199,165 | A | 4/1993 | Crawford |
| 6,483,705 | B2 | 11/2002 | Snyder |
| 7,061,763 | B2 | 6/2006 | Tsoi |
| 7,065,173 | B2 | 6/2006 | Lacey |
| 7,403,392 | B2 | 7/2008 | Attlesey et al. |
| 7,724,524 | B1 | 5/2010 | Campbell et al. |
| 7,770,630 | B2 * | 8/2010 | Chesser ............... F28D 15/0266 165/122 |
| 7,957,132 | B2 | 6/2011 | Fried |
| 8,179,677 | B2 | 5/2012 | Campbell et al. |
| 8,203,842 | B2 | 6/2012 | Campbell et al. |
| 8,322,154 | B2 | 12/2012 | Campbell |
| 9,261,310 | B2 | 2/2016 | Fried |

(Continued)

FOREIGN PATENT DOCUMENTS

| | | | | |
|---|---|---|---|---|
| EP | 3102013 | A1 * | 12/2016 | ......... H05K 7/20309 |
| JP | 2011038738 | A | 2/2011 | |

*Primary Examiner* — Gordon A Jones
(74) *Attorney, Agent, or Firm* — Edward J. Wixted, III

(57) ABSTRACT

A sealed dual-phase evaporative cooling enclosure is disclosed. The sealed dual-phase evaporative cooling enclosure comprises one or more high-heat dissipating components, one or more low-heat dissipating components, a wicking structure; and a condenser, where the wicking structure is proximal to one or more high-heat dissipating components and the condenser, the wicking structure collects liquid coolant from the condenser, the one or more high-heat dissipating components evaporate liquid coolant from the wicking structure to generate vapor, and the vapor is utilized to cool the one or more low-heat dissipating components. A computer-implemented method and computer program product are also disclosed. A processor retrieves temperature data associated high-heat dissipating components. A processor retrieves associated with a wicking structure in the sealed dual-phase evaporative cooling enclosure. A processor adjusts the coolant flow to the condenser in the sealed dual-phase evaporative cooling enclosure based on the temperature data and the saturation data.

12 Claims, 7 Drawing Sheets

(56) References Cited

U.S. PATENT DOCUMENTS

| | | | |
|---|---|---|---|
| 9,332,674 B2* | 5/2016 | Campbell | H05K 7/20236 |
| 10,224,264 B1 | 3/2019 | Merrikh | |
| 10,765,033 B1* | 9/2020 | Keehn | H05K 7/20327 |
| 2019/0339020 A1* | 11/2019 | Tseng | F28D 15/043 |
| 2020/0323100 A1 | 10/2020 | Chiu | |
| 2023/0262930 A1* | 8/2023 | Chen | H05K 7/20381 |
| | | | 361/699 |
| 2023/0345673 A1* | 10/2023 | Trieu | H05K 7/203 |

* cited by examiner

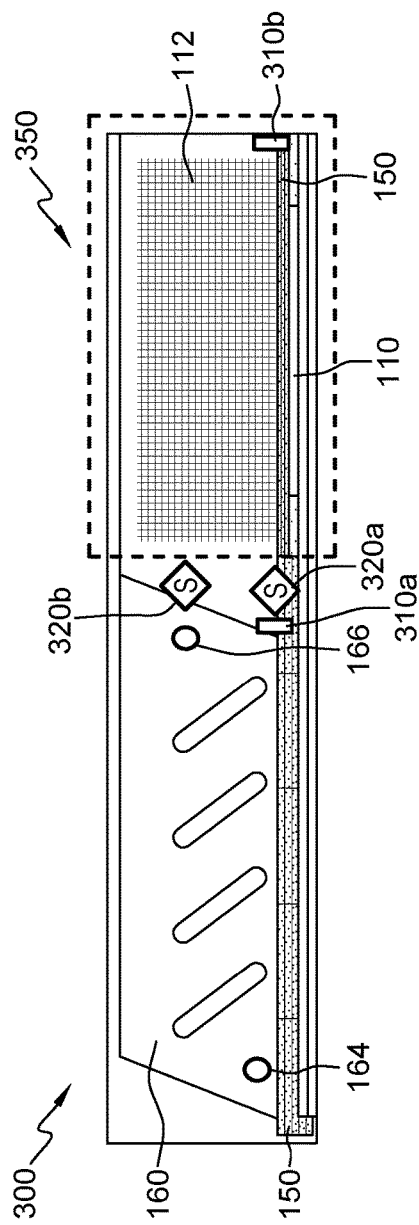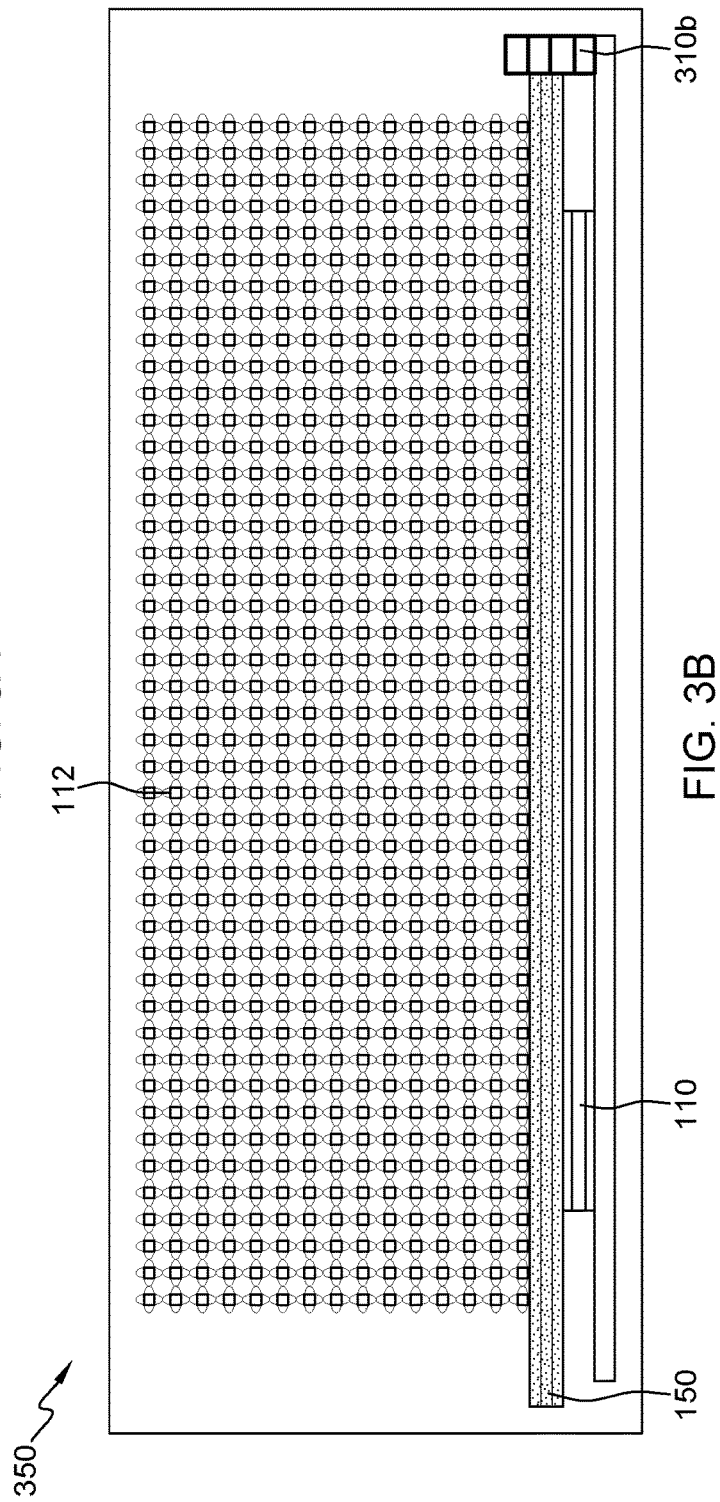
FIG. 3A
FIG. 3B

DUAL-PHASE EVAPORATIVE COOLING IN SEALED ELECTRONICS DEVICES

BACKGROUND OF THE INVENTION

The present invention relates generally to the field of cooling electronic components, and more particularly to utilizing vapor produce from an evaporative cooler to provide additional cooling to other components in a server rack or drawer enclosure.

Immersion cooling is the process of submerging electronic components in a dialectic coolant to provide cooling but limit electricity from conduction in the coolant. Components are completely submerged and take advantage of the greater heat absorption of the coolant as compared to air or other cooling methods. However, while these benefits are great for cooling, immersion cooling has many drawbacks including increased weight due to the liquid occupying the entire cavity of a device as the parts are immersed.

SUMMARY

Embodiments of the present invention provide a sealed dual-phase evaporative cooling enclosure. The sealed dual-phase evaporative cooling enclosure comprises one or more high-heat dissipating components, one or more low-heat dissipating components, a wicking structure; and a condenser, where the wicking structure is proximal to one or more high-heat dissipating components and the condenser, the wicking structure collects liquid coolant from the condenser, the one or more high-heat dissipating components evaporate liquid coolant from the wicking structure to generate vapor, and the vapor is utilized to cool the one or more low-heat dissipating components.

Embodiments of the present invention provide a computer-implemented method and computer program product to control flow rate of coolant to a sealed dual-phase evaporative cooling enclosure. A processor retrieves temperature data associated high-heat dissipating components. A processor retrieves associated with a wicking structure in the sealed dual-phase evaporative cooling enclosure. A processor adjusts the coolant flow to the condenser in the sealed dual-phase evaporative cooling enclosure based on the temperature data and the saturation data.

BRIEF DESCRIPTION OF THE SEVERAL VIEWS OF THE DRAWINGS

FIG. 3A depicts a side view of condenser and porous heat sink connected to a wicking structure.

FIG. 3B depicts a close-up side view of the porous heat sink connected to a wicking structure.

DETAILED DESCRIPTION

Embodiments of the present invention provide for a sealed electronic device enclosure with dual-phase evaporative cooling. Embodiments of the present invention recognize that vapor from evaporative cooling for certain elements of the sealed electronic device can be re-used in another phase of cooling additional elements of the sealed electronic device. Prior solutions utilize immersion cooling which immerses or completely covers elements of a sealed electronic device in a liquid coolant. Immersion cooling greatly increases weight as most of the internal volume of the sealed electronic device will be occupied with heavy liquids. Additionally, immersion cooling typically requires specialized mounts or enclosures that do not easily sit in a server rack without modification.

Embodiments of the present invention provide a new and novel solution to cooling that deploys evaporative cooling for high-heat dissipating components without complete immersion, which provides for the utilization of vapor produced by the evaporative cooling of high-heat dissipating components to cool low-heat dissipating components. As such, embodiments of the present invention provide a dual-phase cooling system that supplies coolant to a cooling system for high-heat dissipating components, such a processor, which in turn produce vapor. Embodiments of the present invention then utilize the vapor to cool other lower heat dissipating components, such as system memory. By not completely immersing components, embodiments of the present invention provide a solution to evaporative cooling that lowers overall weight and can be deployed in a drawer of a server rack.

Figure 1:
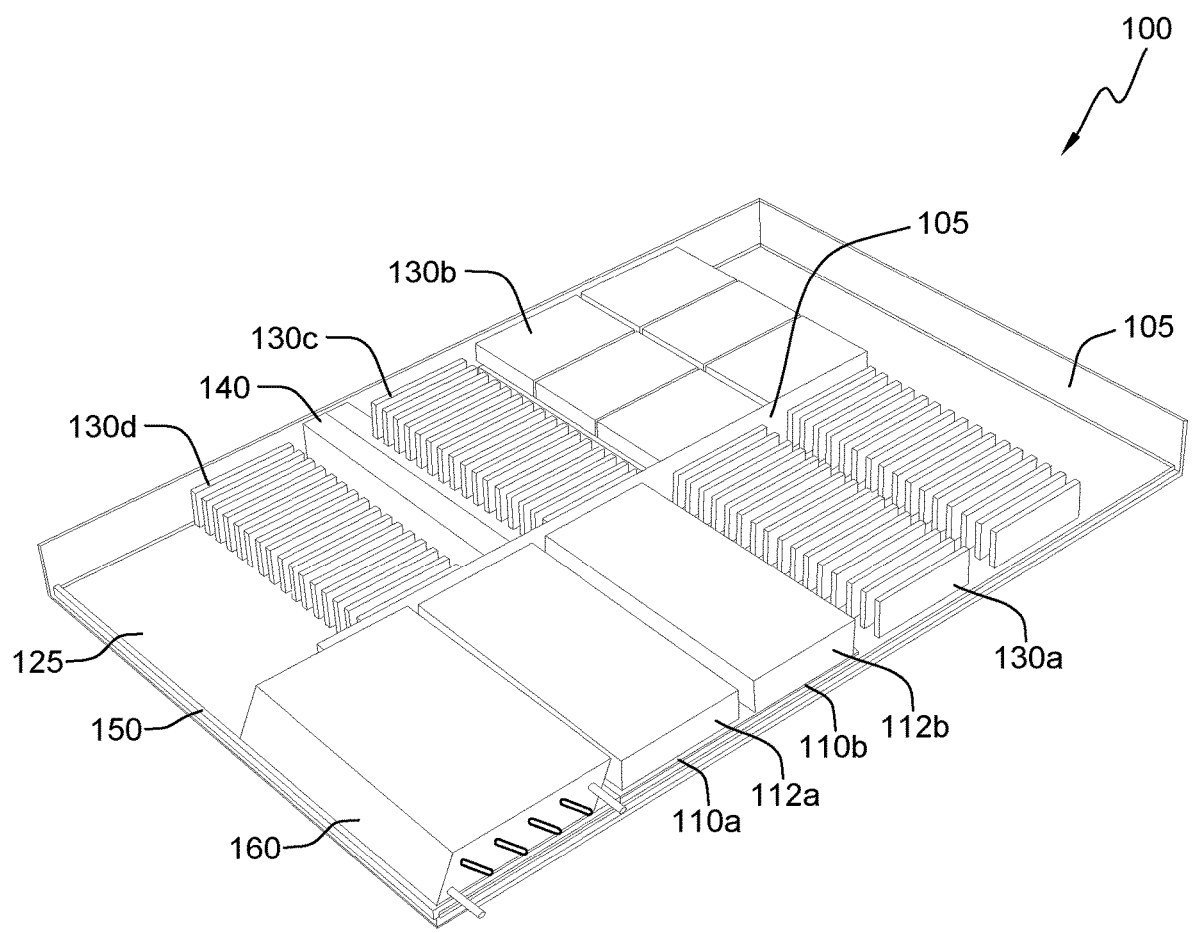
FIG. 1 depicts a perspective view of a sealed electronic device enclosure with dual-phase evaporative cooling.

FIG. 1 depicts a perspective view 100 of sealed electronic device enclosure 105 with dual-phase evaporative cooling. Sealed electronic device enclosure 105 comprises various components that form a channel for vapor from evaporated liquid coolant to be used as a second-phase coolant. High-heat dissipating components 110a-b are components of the sealed electronic device enclosure 105 that generate large amounts of heat. For example, high-heat dissipating components 110a-b may include a central processing unit (CPU), graphics processing unit (GPU), or any application-specific integrated circuit (ASIC), such as an artificial intelligence or neural network processor. As discussed herein, liquid coolant is used to cool the high-heat dissipating components 110a-b which in turn is used to cool low-heat dissipating components 130a-d.

Low-heat dissipating components 130a-d are cooled by passing the vapor produced from the liquid cooling over the low-heat dissipating components 130a-d. Low-heat dissipating components 130a-d are any components in sealed electronic device enclosure 105 that dissipate less heat than high-heat dissipating components 110a-b. For example, low-heat dissipating components 130a-d may include system memory such as random access memory (RAM), storage components such as solid-state drives (SSD), network controllers and any other component typically found in server racks or drawer enclosures. One of ordinary skill in the art will recognize that the terms "high-heat dissipating components" and "low-heat dissipating components" are used to illustrate the different cooling needs of the different component types, where high-heat dissipating components 110a-b require more efficient cooling than low-heat dissipating components 130*a*-*d*. As such, based on the needs and design of the components, an engineer may need to apply different cooling needs. For example, some non-volatile memory express (NVMe) modules can reach more than 90° Celsius at peak loads and may require, or increase performance, with liquid coolant used for heat dissipating components 110*a*-*b*.

Fans 140 create airflow to encourage vapor dispersion across low-heat dissipating components 130*a*-*d* and to combat collection of water droplets within sealed electronic device enclosure 105. Guide wall 120 creates a channel of vapor flow (depicted in FIG. 2) which guides vapor across low-heat dissipating components 130*a*-*d* and to be collected by wick structure 150 and condenser 160. The vapor then condenses back to a liquid form and is then re-used to cool high-heat dissipating components 110*a*-*b*.

Wick structure 150 is an absorbent material that is placed in the bottom of the sealed electronic device enclosure 105. As vapor condenses and forms droplets, the droplets will fall and collect on circuit board 125. At one or more places along the walls of the sealed electronic device enclosure 105, wick structure 150 is exposed for droplets to be absorbed. Additionally, wick structure 150 surrounds or are proximal to portions of high-heat dissipating components 110*a*-*b*. Given wick structure 150 is at a certain level of saturation, the wick structure 150 provides cooling of the high-heat dissipating components 110*a*-*b* that evaporates moisture from the wick structure 150 to reinvigorate the dual phase cooling process discussed herein.

In various embodiments, wick structure 150 is a sintered metal wick structure. Sintered wicks are structures formed from sintered metal powders. Sintered metal powders are metal powders that are pressed and heated to form a metallic structure. Due to the use of powders in forming the sintered wick structure, sintered wicks typically are porous with a porosity as low as 45% up to roughly 70%. As such, sintered wicks can be molded and designed to specific limitations required in small enclosure, such as in a server rack. Additionally, since sintered wick structures are metallic, they can be bonded to other metallic objects (such as condenser 160) providing both heat transfer and moisture wicking needed to perform the dual phase cooling discussed herein. In some embodiments, wick structure 150 may be porous polymers and other fabric wicks to encourage absorption of droplets in certain areas of sealed electronic device enclosure 105, such as the side walls. One or ordinary skill in the art will appreciate that any material that is porous and can provide capillary force to drive liquid towards high-heat dissipating components 110*a*-*b* can be used as wick structure 150 without deviating from the invention.

In various embodiments, condenser 160 is placed towards the end of the channel to encourage reclamation of vapor in the sealed electronic device enclosure 105 into droplets to collect in wick structure 150. Condenser 160 cools the surrounding air via a heat exchange that absorbs heat from the sealed electronic device enclosure 105 cooling surrounding vapor into water droplets. Wick structure 150 is placed below condenser 160 to collect and direct moisture towards high-heat dissipating components 110*a*-*b*.

In some embodiments, porous metal heatsink(s) 112*a*-*b* are affixed to the top part of the chip package of high-heat dissipating components 110*a*-*b*. In other embodiments, porous heatsink 112*a*-*b* can also be standard solid fin heatsink with surface etched. The heatsink metal fin surfaces have grooved channel on one side or both sides to guide the condensed liquid flow moving from the heatsink bottom and then the flow will be covering the fin surface because of capillary force. The grooved channels behave similar as the porous metal structure.

In various embodiments, porous metal heatsink(s) 112*a*-*b* are metal heat sinks that include some portion that is composed of a porous metal heatsink(s) 112*a*-*b* are formed by gravity sintering metallic particles. Gravity sintering is essentially a casting process where metallic particles are shaped, pre-tinned with a eutectic and flux agent, poured in a mold and then heated to a temperature above the eutectic. The bonded piece is then removed from the mold, creating various open "cells" that increase surface area and airflow. In some embodiments of the present invention, the "cells" of porous metal heatsink(s) 112*a*-*b* provide areas for water droplets to form from nearby condenser 160. As condenser 160 cools the circulating vapor, the vapor will condense into droplets, collecting into wick structure 150. The condensed fluid will then be transported, via capillary force of wick structure 150 into the porous metal heatsink(s) 112*a*-*b*, providing additional evaporative cooling as well as generating additional vapor to cool low-heat dissipating components 130*a*-*d*.

Figure 2:
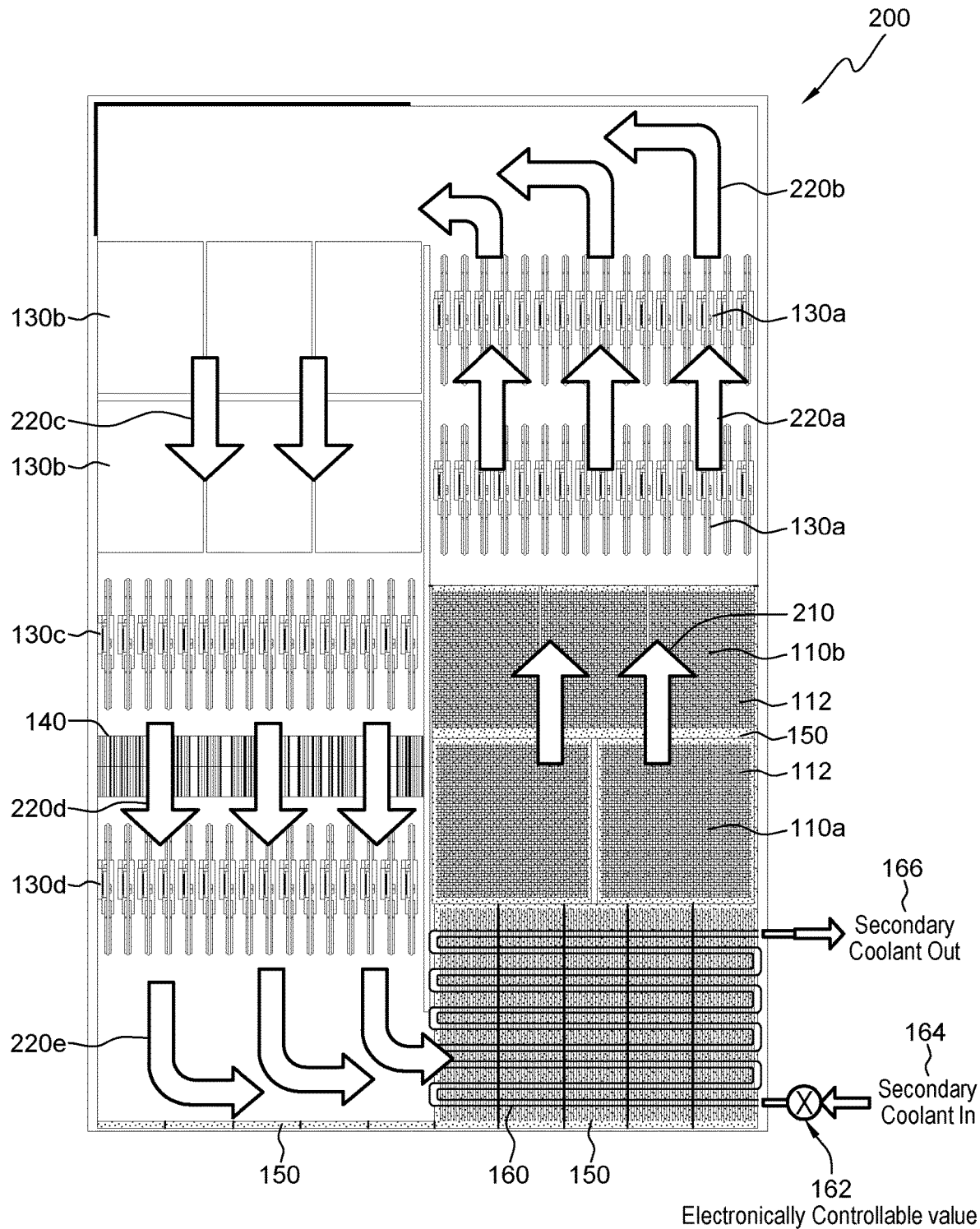
FIG. 2 depicts a top-down view of a sealed electronic device enclosure with dual-phase evaporative cooling with a depiction of vapor-phase flow.

FIG. 2 depicts a top-down view, designated as 200, of sealed electronic device enclosure 105 with dual-phase evaporative cooling with a depiction of vapor-phase flow. As discussed herein, when being cooled by saturated wick structure 150, high-heat dissipating components 110*a*-*b* evaporate 210 the coolant into a vapor 220*a*-*e*. Fans 140 encourage airflow, indicated by the arrows of vapor 220*a*-*e*, across low-heat dissipating components 130*a*-*d*, to be penultimately directed towards condenser 160. Condenser 160 cools vapor 220*a*-*e* to condense as droplets and collect in wick structure 150, which is used in the evaporative cooling 210 of high-heat dissipating components 110*a*-*b*.

In various embodiments, condenser 160 is operated via control valve 162 which controls intake 164 and outtake 166. As discussed in detail in regards to FIG. 6, based on the temperature of high-heat dissipating components 110*a*-*b* and saturation levels of wick structure 150, control valve 162 is adjusted to alter the amount of saturation within wick structure 150 to ensure proper operation and cooling of the components in sealed electronic device enclosure 105.

FIG. 3A depicts a side view, depicted as 300, of condenser 160 and porous heat sink 112 connected to wick structure 150, providing cooling to a high-heat dissipating component 110. As discussed herein, both wick structure 150 and porous heat sink 112 should be placed in proximity to condenser 160 to encourage quick replenishment of condensed coolant. FIG. 3A also depicts placement of saturation sensors 310*a*-*b* and temperature sensors 320*a*-*b*. As discussed in detail in regards to FIG. 6, embodiments of the present invention monitor the saturation levels of wick structure 150 to ensure proper vapor production and to prevent wick structure 150 from being damaged to high heat exposure. Saturation sensors 310*a*-*b* monitor the amount of liquid coolant saturated in wick structure 150. If not enough moisture is detected in wick structure 150, condenser 160 may be adjusted to increase condensation within sealed electronic device enclosure 105.

Additionally, temperature sensors 320*a*-*b* monitor the temperatures of various components and location within sealed electronic device enclosure 105. In some scenarios, such as with CPU's or GPU's, components of the sealed electronic device enclosure 105 may provide temperature readings of the components. If a component or sensor indicates a temperature above a certain threshold, then condenser 160 may be adjusted to increase condensation, and thereby the amount of cooling, within sealed electronic device enclosure 105.

FIG. 3B depicts a close-up side view, designated 350, of porous heat sink 112 connected to a wicking structure 150 and high-heat dissipating component 110. Wicking structure 150 is depicted to be in-between heat sink and high-heat dissipating component 110. While not shown, it should be understood that a portion of porous heat sink 112 is thermally coupled to high-heat dissipating component 110 to provide for a heat transfer between the two components. In this arrangement, droplets from the porous heat sink 112 that form from condenser 160 may collect into large enough droplets to fall. With this arrangement, droplets can be quickly reclaimed in wicking structure 150 to provide direct cooling.

Figure 4A:
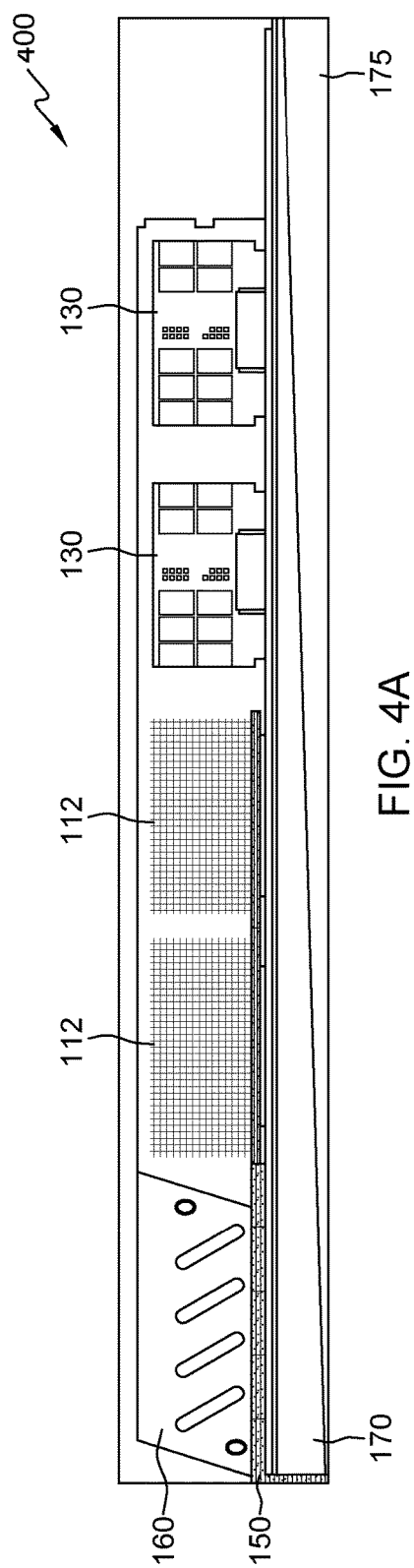
FIG. 4A depicts a side view of a condensation collection device in a horizontally-situated sealed electronic device enclosure.

FIG. 4A depicts a side view, designated 400 of condensation collection device 175 in a horizontally-situated sealed electronic device enclosure. In some embodiments, sealed electronic device enclosure 105 includes a bottom condensation collection device 175 to collect and stored coolant. Since saturation of wick structure 150 must be maintained to provide effective cooling, condensation collection device 175 is provided to provide a reservoir 170 for coolant to keep wick structure 150 saturated. Condensation collection device 175 in slanted or otherwise situated to encourage collection near condenser 160 and wick structure 150.

Figure 4B:
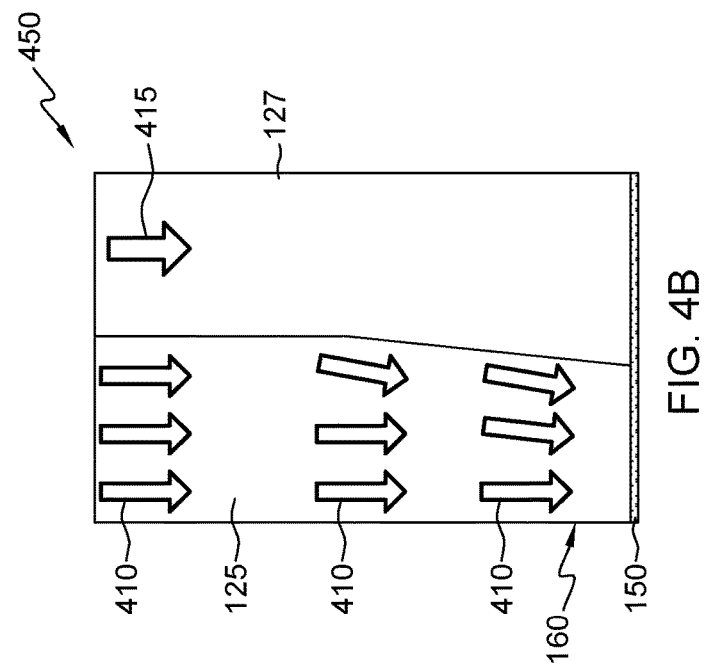
FIG. 4B depicts a top-down view of a condensation collection device in a vertically-situated sealed electronic device enclosure.

FIG. 4B depicts a top-down view 450 of a vertical condensation collection device 127 in a vertically-situated sealed electronic device enclosure. As with the slanted design of bottom condensation collection device 175, vertical condensation collection device 127 provides a reservoir 410 for condensation that for vertically mounted enclosures, where gravity 415 pulls droplets and collected coolant towards condenser 160 and wick structure 150. Vertical condensation collection device 127 is slanted or otherwise funnels collected condensation towards condenser 160 and wick structure 150.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 5:
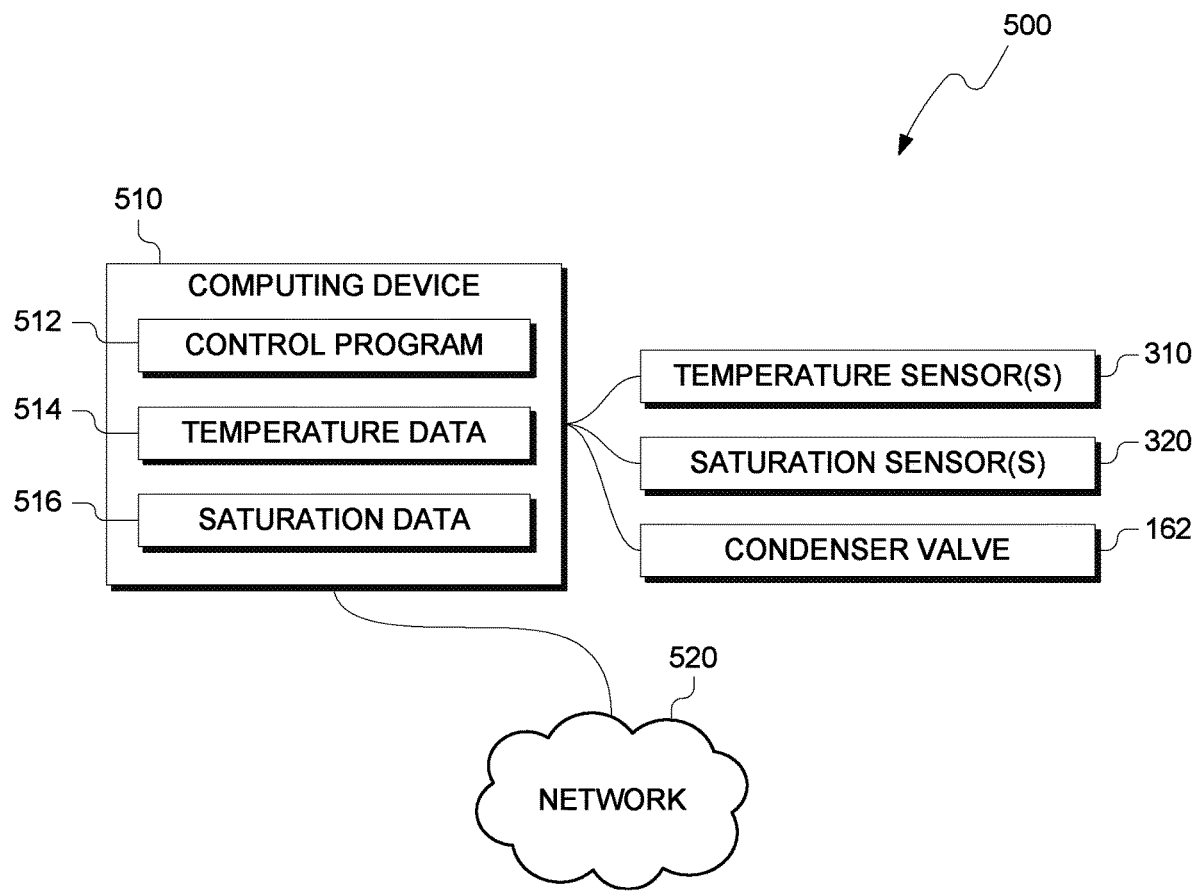
FIG. 5 is a functional block diagram illustrating a computing environment to provide condenser control.

FIG. 5 is a functional block diagram illustrating computing environment, generally designated 500, in accordance with one embodiment of the present invention. Computing environment 500 includes computing device 510. Computing device 510 includes control program 512, temperature data 514, and saturation data 516.

In various embodiments of the present invention, computing device 510 can be a standalone device, a server, a laptop computer, a tablet computer, a netbook computer, a personal computer (PC), or a desktop computer. In another embodiment, computing device 510 represents a computing system utilizing clustered computers and components to act as a single pool of seamless resources. In general, computing device 510 can be any computing device or a combination of devices with access to control program 512, temperature data 514, and saturation data 516. Computing device 110 may include internal and external hardware components, as depicted and described in further detail with respect to FIG. 7.

In this exemplary embodiment, control program 512, temperature data 514, and saturation data 516 on computing device 510. However, in other embodiments, control program 512, temperature data 514, and saturation data 516 may be stored externally and accessed through a communication network, such as network WAN 702. In general, WAN 702 can be any combination of connections and protocols that will support communications between computing device 510 and other connected devices (not shown), in accordance with a desired embodiment of the present invention In various embodiments, control program 512 monitors various temperature sensor(s) 310 and saturation sensor(s) 320 placed within or otherwise situated within sealed device enclosure 105. In some embodiments, temperature sensor(s) 310 are temperature monitors embedded in high-heat dissipating components 110a-b. Many CPUs and GPUs have embedded temperature sensors to convey to operating systems and other applications the temperature of the CPU, GPU, individual cores and the like. In other embodiments, temperature sensor(s) 310 are external to high-heat dissipating components 110a-b and monitor temperatures within sealed device enclosure 105. Saturation sensor(s) 320 are moisture or humidity sensors affixed to or placed near wicking structure 150. As wick structure 150 becomes saturated, saturation sensor(s) 320 indicate a higher moisture or humidity reading.

In various embodiments, control program 512 retrieves readings from temperature sensor(s) 310 and saturation sensor(s) 320, storing the readings respectively temperature data 514 and saturation data 516. Based of the readings, control program 512 will alter the amount of coolant flow to condenser 160 via condenser valve 162.

Figure 6:
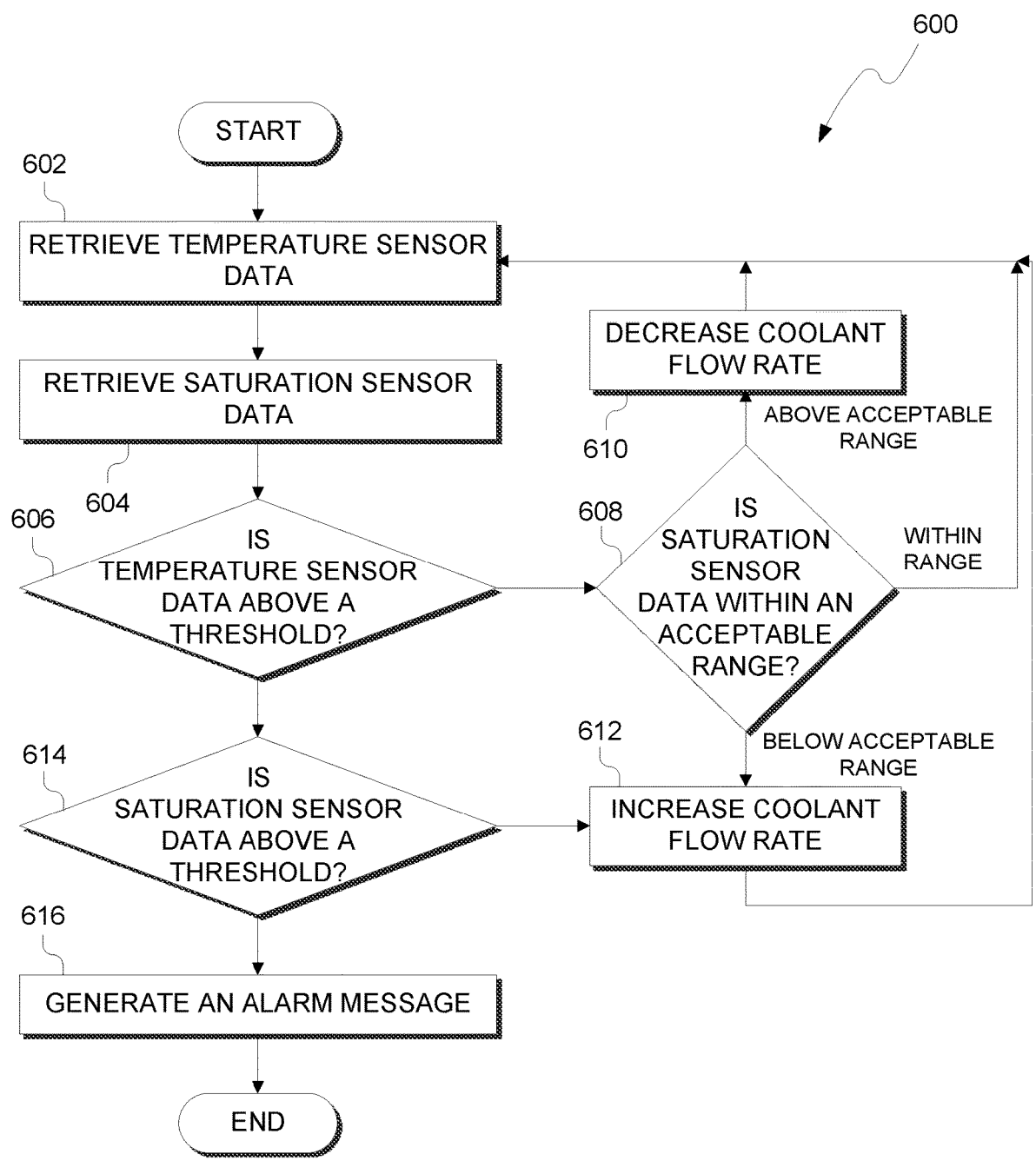
FIG. 6 illustrates operational processes of a control program for condenser control.

FIG. 6 depicts a flowchart of the processes of control program 512, generally designated as 600. In process 602, control program 512 retrieves temperature sensor data from temperature sensor(s) 310. As discussed herein, temperature sensor(s) 310 may provide temperature readings from high-heat dissipating components 110a-b or may provide temperature readings from the vapor and air within sealed device enclosure 105. In process 604, control program 512 retrieves saturation sensor data from saturation sensor(s) 320. As discussed herein, saturation sensor(s) 320 provide moisture or humidity readings of the environment within sealed device enclosure 105. Typically, saturation sensor(s) 320 should be placed on or near wick structure 150 since saturation of wick structure 150 is needed to produce vapor and maintain cooling for components in sealed device enclosure 105. However, saturation sensor(s) 320 may be placed in other areas within sealed device enclosure 105 to monitor moisture or humidity readings for other areas of sealed device enclosure 105 as well.

In various embodiments, control program 512 routinely retrieves temperature data 514 and saturation data 516 from the various sensors (processes 602 and 604). Based on the readings, control program 512 may adjust coolant flow to condenser 160 (processes 610 and 612) or in some instances generate an alarm (process 616) if operating conditions become dangerous or ineffective at cooling sealed device enclosure 105.

In decision process 606, control program 512 evaluates temperature data 514 of the various components and locations within sealed device enclosure 105. If a reading of a component or location is below a threshold value (e.g., less than 80° C.) (NO Branch of decision process 606), then control program 512 evaluates saturation data 516 (decision process 608). Given a CPU is operating below the temperature ceiling, then the CPU is assumed to be cooled properly. As such, control program 512 evaluates saturation data 516 to determine if wicking structure 150 needs adjustments to moisture being held. If saturation data 516 indicates that moisture of humidity is within an acceptable range, then control program 512 does not adjust condenser valve 162 and maintains the current flow rate, returning to monitoring temperature data 514 and saturation data 516 (processes 602 and 604).

If the saturation data 516 indicates that the moisture absorbed by wicking structure is below an acceptable value, then control program 512 increases the flow rate of coolant to condenser 160 (process 612). Even if a CPU is giving a below threshold reading, wicking structure 150 needs to be kept saturated to maintain proper dual-phase cooling. As such, when saturation data 516 is below the acceptable range of the wicking structure 150 (e.g., less than 50% saturation), then control program 512 will increase coolant rate in a small incremental amount to slowly increase moisture buildup in wicking structure 150. Once the saturation data 516 indicates wicking structure 150 is saturated at above an acceptable level, then control program 512 lowers the flow rate (process 610) until a equilibrium between flow rate and acceptable saturation is achieved.

If the saturation data 516 indicates that the moisture absorbed by wicking structure is above an acceptable value, then control program 512 decreases the flow rate of coolant to condenser 160 (process 610). In various scenarios, moisture accumulates and replenishes wicking structure 150 during normal operation. As such, wicking structure 150 will fluctuate in saturation as coolant evaporates, creates vapor, condenses, then collects in wicking structure 150. If wicking structure 150 has saturation above the acceptable range (e.g., greater than 70% saturation), then control program 512 decreases flow rate of coolant (process 610) such that built up moisture in wicking structure 150 can be evaporated, naturally lowering the saturation over time.

In scenarios where temperature data 514 is above a threshold value (e.g., greater than 80° C.) (NO Branch of decision process 614), then high-heat dissipating components 110a-b are approaching dangerous operating condition and may damage the components. As such, control program 512 polls saturation data 516. If the wicking structure 150 is not saturated above a threshold value (e.g., less than 60%), then control program 512 increases flow rate to condenser 160 via condenser valve 162. As opposed to when high-heat dissipating components 110a-b are within acceptable temperature values (e.g., less than 80° C.) leading to decision process 608, when high-heat dissipating components 110a-b will increase flow rate at a larger factor that when only when saturation levels are below acceptable range. Since high-heat dissipating components 110a-b are reaching dangerous operating conditions, control program 512 will increase flow rate to a maximum or at one greater to an increase in flow rate than to replenish wicking structure 150 when high-heat dissipating components 110a-b are within normal operating conditions.

In scenarios where temperature data 514 is above a threshold value but saturation data 516 indicates acceptable levels (e.g., ~60%), then an operating issue has occurred in which wicking structure 150 can no longer provide adequate cooling of the components in seal device enclosure 105. As such, control program 512 generates an alarm message for an operator or administrator of sealed device enclosure 105 to insect to device (process 616). In this scenario, control program 512 may restrict the clock rate of high-heat dissipating components 110a-b to decrease power dissipation. In other scenarios, control program 512 disable one or more components within sealed device enclosure 105 to ensure damage to the components does not occur.

Figure 7:
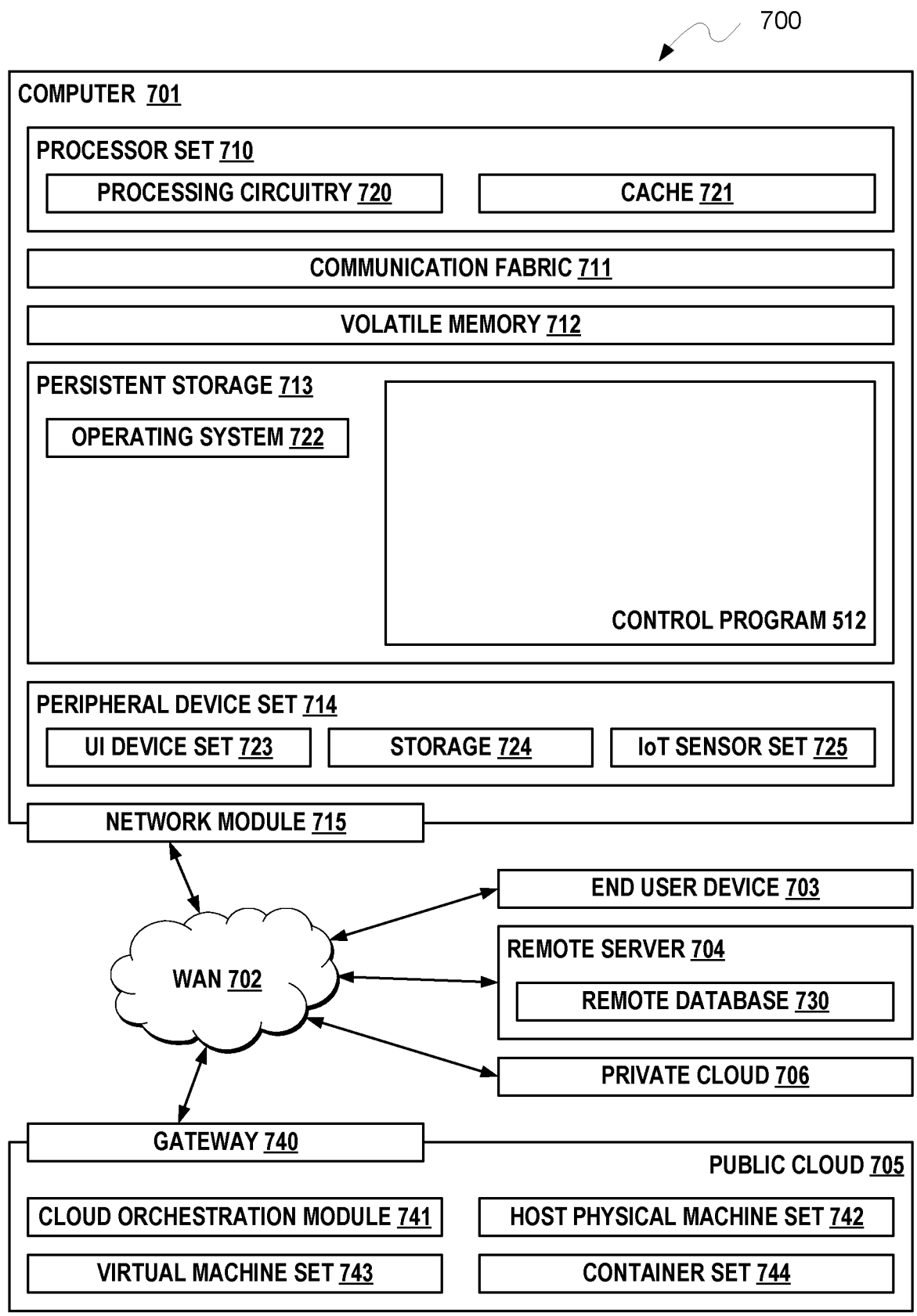
FIG. 7 depicts a block diagram of components of the computing device executing a control program for condenser control.

FIG. 7 depicts computing environment 700 as an example of an environment for the execution of at least some of the computer code involved in performing the inventive methods, such as runtime manger program 112. In addition to control program 512, computing environment 700 includes, for example, computer 701, wide area network (WAN) 702, end user device (EUD) 703, remote server 704, public cloud 705, and private cloud 706. In this embodiment, computer 701 includes processor set 710 (including processing circuitry 720 and cache 721), communication fabric 711, volatile memory 712, persistent storage 713 (including operating system 722 and control program 512, as identified above), peripheral device set 714 (including user interface (UI) device set 723, storage 724, and Internet of Things (IoT) sensor set 725), and network module 715. Remote server 704 includes remote database 730. Public cloud 705 includes gateway 740, cloud orchestration module 741, host physical machine set 742, virtual machine set 743, and container set 744.

COMPUTER 701 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 730. As is well understood in the art of computer technology, and depending upon the technology, performance of a computer-implemented method may be distributed among multiple computers and/or between multiple locations. On the other hand, in this presentation of computing environment 700, detailed discussion is focused on a single computer, specifically computer 701, to keep the presentation as simple as possible. Computer 701 may be located in a cloud, even though it is not shown in a cloud in FIG. 7. On the other hand, computer 701 is not required to be in a cloud except to any extent as may be affirmatively indicated.

PROCESSOR SET 710 includes one, or more, computer processors of any type now known or to be developed in the future. Processing circuitry 720 may be distributed over multiple packages, for example, multiple, coordinated integrated circuit chips. Processing circuitry 720 may implement multiple processor threads and/or multiple processor cores. Cache 721 is memory that is located in the processor chip package(s) and is typically used for data or code that should be available for rapid access by the threads or cores running on processor set 710. Cache memories are typically organized into multiple levels depending upon relative proximity to the processing circuitry. Alternatively, some, or all, of the cache for the processor set may be located "off chip." In some computing environments, processor set 710 may be designed for working with qubits and performing quantum computing.

Computer readable program instructions are typically loaded onto computer 701 to cause a series of operational steps to be performed by processor set 710 of computer 701 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 721 and the other storage media discussed below. The program instructions, and associated data, are accessed by processor set 710 to control and direct performance of the inventive methods. In computing environment 700, at least some of the instructions for performing the inventive methods of control program 512 can be at least stored in persistent storage 713.

COMMUNICATION FABRIC 711 is the signal conduction path that allows the various components of computer 701 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 712 is any type of volatile memory now known or to be developed in the future. Examples include dynamic type random access memory (RAM) or static type RAM. Typically, volatile memory 712 is characterized by random access, but this is not required unless affirmatively indicated. In computer 701, the volatile memory 712 is located in a single package and is internal to computer 701, but, alternatively or additionally, the volatile memory may be distributed over multiple packages and/or located externally with respect to computer 701.

PERSISTENT STORAGE 713 is any form of non-volatile storage for computers that is now known or to be developed in the future. The non-volatility of this storage means that the stored data is maintained regardless of whether power is being supplied to computer 701 and/or directly to persistent storage 713. Persistent storage 713 may be a read only memory (ROM), but typically at least a portion of the persistent storage allows writing of data, deletion of data and re-writing of data. Some familiar forms of persistent storage include magnetic disks and solid state storage devices. Operating system 722 may take several forms, such as various known proprietary operating systems or open source Portable Operating System Interface-type operating systems that employ a kernel. The code included in control program 512 typically includes at least some of the computer code involved in performing the inventive methods.

PERIPHERAL DEVICE SET 714 includes the set of peripheral devices of computer 701. Data communication connections between the peripheral devices and the other components of computer 701 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 723 may include components such as a display screen, speaker, microphone, wearable devices (such as goggles and smart watches), keyboard, mouse, printer, touchpad, game controllers, and haptic devices. Storage 724 is external storage, such as an external hard drive, or insertable storage, such as an SD card. Storage 724 may be persistent and/or volatile. In some embodiments, storage 724 may take the form of a quantum computing storage device for storing data in the form of qubits. In embodiments where computer 701 is required to have a large amount of storage (for example, where computer 701 locally stores and manages a large database) then this storage may be provided by peripheral storage devices designed for storing very large amounts of data, such as a storage area network (SAN) that is shared by multiple, geographically distributed computers. IoT sensor set 725 is made up of sensors that can be used in Internet of Things applications. For example, one sensor may be a thermometer and another sensor may be a motion detector.

NETWORK MODULE 715 is the collection of computer software, hardware, and firmware that allows computer 701 to communicate with other computers through WAN 702. Network module 715 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 715 are performed on the same physical hardware device. In other embodiments (for example, embodiments that utilize software-defined networking (SDN)), the control functions and the forwarding functions of network module 715 are performed on physically separate devices, such that the control functions manage several different network hardware devices. Computer readable program instructions for performing the inventive methods can typically be downloaded to computer 701 from an external computer or external storage device through a network adapter card or network interface included in network module 715.

WAN 702 is any wide area network (for example, the internet) capable of communicating computer data over non-local distances by any technology for communicating computer data, now known or to be developed in the future.

In some embodiments, the WAN 702 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 703 is any computer system that is used and controlled by an end user (for example, a customer of an enterprise that operates computer 701), and may take any of the forms discussed above in connection with computer 701. EUD 703 typically receives helpful and useful data from the operations of computer 701. For example, in a hypothetical case where computer 701 is designed to provide a recommendation to an end user, this recommendation would typically be communicated from network module 715 of computer 701 through WAN 702 to EUD 703. In this way, EUD 703 can display, or otherwise present, the recommendation to an end user. In some embodiments, EUD 703 may be a client device, such as thin client, heavy client, mainframe computer, desktop computer and so on.

REMOTE SERVER 704 is any computer system that serves at least some data and/or functionality to computer 701. Remote server 704 may be controlled and used by the same entity that operates computer 701. Remote server 704 represents the machine(s) that collect and store helpful and useful data for use by other computers, such as computer 701. For example, in a hypothetical case where computer 701 is designed and programmed to provide a recommendation based on historical data, then this historical data may be provided to computer 701 from remote database 730 of remote server 704.

PUBLIC CLOUD 705 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 705 is performed by the computer hardware and/or software of cloud orchestration module 741. The computing resources provided by public cloud 705 are typically implemented by virtual computing environments that run on various computers making up the computers of host physical machine set 742, which is the universe of physical computers in and/or available to public cloud 705. The virtual computing environments (VCEs) typically take the form of virtual machines from virtual machine set 743 and/or containers from container set 744. It is understood that these VCEs may be stored as images and may be transferred among and between the various physical machine hosts, either as images or after instantiation of the VCE. Cloud orchestration module 741 manages the transfer and storage of images, deploys new instantiations of VCEs and manages active instantiations of VCE deployments. Gateway 740 is the collection of computer software, hardware, and firmware that allows public cloud 705 to communicate through WAN 702.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 706 is similar to public cloud 705, except that the computing resources are only available for use by a single enterprise. While private cloud 706 is depicted as being in communication with WAN 702, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 705 and private cloud 706 are both part of a larger hybrid cloud.

What is claimed is:

1. A sealed dual-phase evaporative cooling enclosure, comprising:
    one or more high-heat dissipating components;
    one or more low-heat dissipating components;
    a wicking structure;
    a guide wall separating the one or more high-heat dissipating components from a low-heat dissipating component and providing a channel of vapor flow across the low-heat dissipating component; and
    a condenser, wherein:
        the wicking structure is partially enclosed by the guide wall and proximal to one or more high-heat dissipating components and the condenser;
        the wicking structure collects liquid coolant from the condenser;
        the one or more high-heat dissipating components evaporate liquid coolant from the wicking structure to generate vapor; and
        the vapor is utilized to cool the one or more low-heat dissipating components.

2. The sealed dual-phase evaporative cooling enclosure of claim 1, wherein the one or more high-heat dissipating components include one selection from the group consisting of: a central processing unit (CPU), a graphics processing unit (GPU), or an application-specific integrated circuit (ASIC).

3. The sealed dual-phase evaporative cooling enclosure of claim 1, wherein the one or more low-heat dissipating components are selected from the group consisting of: random access memory (RAM), solid-state drives (SSDs), or network controllers.

4. The sealed dual-phase evaporative cooling enclosure of claim 1, wherein the wicking structure is composed of sintered metal powders.

5. The sealed dual-phase evaporative cooling enclosure of claim 4, wherein the sintered metal powders provide capillary force to drive the collected liquid coolant towards the one or more high-heat dissipating components.

6. The sealed dual-phase evaporative cooling enclosure of claim 5, the sealed dual-phase evaporative cooling further comprising:
   a porous metal heat sink, wherein the porous metal heat sink is attached to at least one of one or more high-heat dissipating components.

7. The sealed dual-phase evaporative cooling enclosure of claim 6, wherein the wicking structure is placed underneath the porous metal heat sink to evaporate condensate collected from the condenser.

8. The sealed dual-phase evaporative cooling enclosure of claim 1, the sealed dual-phase evaporative cooling further comprising:
   one or more fans, wherein the one or more fans and guide wall create a channel to encourage vapor flow from the one or more high-heat dissipating components to the one or more low-heat dissipating components.

9. The sealed dual-phase evaporative cooling enclosure of claim 8, wherein the condenser is located at an end of the channel and proximal to at least one of the one or more high-heat dissipating components and the wicking structure.

10. The sealed dual-phase evaporative cooling enclosure of claim 1, the sealed dual-phase evaporative cooling further comprising:
   a reservoir, wherein the reservoir replenishes the wick structure to keep the wick structure saturated during operation.

11. The sealed dual-phase evaporative cooling enclosure of claim 1, wherein a flow rate of coolant to the condenser is increased in response to a temperature of at least one of the one or more high-heat dissipating components being above a threshold temperature value.

12. The sealed dual-phase evaporative cooling enclosure of claim 1, wherein a flow rate of coolant to the condenser is decreased in response to a saturation level of the wick structure being above a threshold saturation value.

* * * * *